United States Patent
Dong et al.

(10) Patent No.: US 9,508,921 B2
(45) Date of Patent: Nov. 29, 2016

(54) ELECTRONIC DEVICE AND METHOD FOR FABRICATING THE SAME

(71) Applicant: SK hynix Inc., Icheon-Si (KR)

(72) Inventors: Cha-Deok Dong, Icheon-Si (KR); Ki-Seon Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 128 days.

(21) Appl. No.: 14/444,952

(22) Filed: Jul. 28, 2014

(65) Prior Publication Data

US 2015/0052302 A1    Feb. 19, 2015

(30) Foreign Application Priority Data

Aug. 16, 2013  (KR) .................. 10-2013-0097365

(51) Int. Cl.
*H01L 29/82* (2006.01)
*H01L 43/08* (2006.01)
*H01L 27/22* (2006.01)
*G11C 11/16* (2006.01)

(52) U.S. Cl.
CPC ............. *H01L 43/08* (2013.01); *H01L 27/222* (2013.01); *G11C 11/16* (2013.01)

(58) Field of Classification Search
CPC ............................... H01L 43/08; G11C 11/16
See application file for complete search history.

(56) References Cited

U.S. PATENT DOCUMENTS

| | | | |
|---|---|---|---|
| 8,213,221 B2 | 7/2012 | Ding et al. | |
| 2006/0256614 A1* | 11/2006 | Hayakawa | B82Y 25/00 365/173 |
| 2008/0258247 A1* | 10/2008 | Mancoff | G11C 11/16 257/421 |
| 2010/0074092 A1* | 3/2010 | Zhu | G11C 11/16 369/126 |
| 2012/0068280 A1* | 3/2012 | Edelstein | G11C 11/161 257/421 |
| 2012/0205758 A1* | 8/2012 | Jan | H01L 29/66984 257/421 |
| 2012/0326250 A1* | 12/2012 | Gaidis | H01L 43/08 257/421 |
| 2013/0080687 A1* | 3/2013 | Nemazie | G06F 12/0246 711/103 |
| 2013/0205076 A1* | 8/2013 | Schuette | G06F 12/0246 711/103 |
| 2014/0084402 A1* | 3/2014 | Shimomura | G11C 11/161 257/427 |
| 2014/0177325 A1* | 6/2014 | Dong | G11C 11/16 365/158 |
| 2014/0211557 A1* | 7/2014 | Ong | G11C 11/1673 365/171 |
| 2015/0021675 A1* | 1/2015 | Min | H01L 43/08 257/295 |

FOREIGN PATENT DOCUMENTS

| | | |
|---|---|---|
| KR | 10-2014-0108918 A | 9/2014 |
| KR | 10-2014-0142929 A | 12/2014 |
| KR | 10-2015-0012511 A | 2/2015 |

OTHER PUBLICATIONS

Chang et al., Reducing the critical switching current in the free layer of magnetic random access memory, Journal of Magnetism and Magnetic Materials (Impact Factor: 1.97). Sep. 2006; 304(1). DOI: 10.1016/j.jmmm.2006.02.022.*

* cited by examiner

*Primary Examiner* — Ryan Bertram
*Assistant Examiner* — Trang Ta
(74) *Attorney, Agent, or Firm* — Perkins Coie LLP

(57) ABSTRACT

The disclosed technology provides an electronic device and a fabrication method thereof, in which an etching margin in formation of a variable resistance element is secured and process difficulty is reduced. An electronic device according to an implementation includes a semiconductor memory, the semiconductor memory including: a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer.

20 Claims, 14 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2013-0097365, entitled "ELECTRONIC DEVICE AND METHOD FOR FABRICATING THE SAME" and filed on Aug. 16, 2013, which is incorporated herein by reference in its entirety.

TECHNICAL FIELD

This patent document relates to memory circuits or devices and their applications in electronic devices or systems.

BACKGROUND

Recently, as electronic device or appliances trend toward miniaturization, low power. consumption, high performance, multi-functionality, and so on, there is a demand for semiconductor devices capable of storing information in various electronic appliances such as a computer, a portable communication device, and so on and research and development for such semiconductor devices have been conducted. Examples of such semiconductor devices include semiconductor devices which can store data using a characteristic that they are switched between different resistance states according to an applied voltage or current, and can be implemented in various configurations including, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an etching margin in the formation of a variable resistance element is secured and process difficulty is reduced.

In one aspect, an electronic device is provided to include a semiconductor memory that includes: a variable resistance element including a stack of a first magnetic layer, a tunnel barrier layer and a second magnetic layer; a contact plug coupling the top of the variable resistance element and including a magnetism correcting layer; and a conductive line coupled to the variable resistance element through the contact plug including the magnetism correcting layer. In another aspect, an electronic device is provided to include a semiconductor memory that includes a variable resistance element including a stack including a first magnetic layer having a variable magnetization, a tunnel barrier layer, and a second magnetic layer having a pinned magnetization; a contact plug coupling a top of the variable resistance element and including a magnetism correcting layer that produces a magnetic field at the variable resistance element to reduce an influence of a magnetic field of the second magnetic layer on the first magnetic layer; and a conductive line coupled to the variable resistance element through the contact plug including the magnetism correcting layer.

Implementations of the above aspects may include one or more the following.

In some implementations, the thickness of the magnetism correcting layer may be greater than width of the magnetism correcting layer. In some implementations, the magnetism correcting layer may include a conductive material having vertical magnetic properties. In some implementations, a magnetization of the magnetism correcting layer is in a plane of the magnetism correcting layer. In some implementations, the magnetism correcting layer may include cobalt (Co), iron (Fe), nickel (Ni), neodymium (Nd), or a mixtures of two or more of Co, Fe, Ni and Nd.

In some implementations, the first magnetic layer may include a pinned ferromagnetic layer, and the second magnetic layer may include a free ferromagnetic layer, or the first magnetic layer includes a free ferromagnetic layer, and the second magnetic layer may include a pinned ferromagnetic layer. In some implementations, the first magnetic layer and the second magnetic layer are ferromagnetic layers. In some implementations, the contact plug further comprises a metal layer comprises a metal layer. In some implementations, the magnetism correcting layer includes a pillar type magnetism correcting layer. In some implementations, the metal layer is formed to surround a sidewall a sidewall of the pillar type magnetism correcting layer. In some implementations, the metal layer includes a ring type metal layer. In some implementations, the metal layer is formed to surround both a sidewall and a bottom surface of the pillar type magnetism correcting layer. In some implementations, the contact plug further comprises a ring type magnetism correcting layer formed to surround a sidewall of the metal layer. In some implementations, the magnetism correcting layer includes a ring type magnetism correcting layer to surround a sidewall of a pillar type metal layer. In some implementations, the magnetism correcting layer comprises: a cylinder type metal layer; an inner pillar type magnetism correcting layer formed in the cylinder type metal layer; and a ring type magnetism correcting layer surrounded a sidewall of the cylinder type metal layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the semiconductor memory unit may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface coupled between the core unit and the cache memory unit, and configured to transmit data between the core unit and the cache memory unit, wherein the semiconductor memory unit that includes the resistance variable element is part of the cache memory unit in the processor.

In some implementations, the semiconductor memory unit may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the semiconductor memory unit may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the semiconductor memory unit may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device is provided to include a semiconductor memory that includes: a variable resistance element including a stack of a first magnetic layer, a tunnel barrier layer and a second barrier layer; a contact plug coupling the top of the variable resistance element and including a cylinder-type magnetism correcting layer; and a conductive layer coupled to the variable resistance element through the contact plug.

In some implementations, the contact plug may include a metal layer, and the metal layer may be formed inside the magnetism correcting layer.

In some implementations, the semiconductor memory unit may include a semiconductor memory, the semiconductor memory including: a variable resistance element including a stack of a first magnetic layer, a tunnel barrier layer and a second barrier layer; a contact plug coupling the top of the variable resistance element and including an inner pillar type magnetism correcting layer; and a conductive layer coupled to the variable resistance element through the contact plug.

In some implementations, the contact plug may include a metal layer, and the metal layer may be formed to surround the magnetism correcting layer.

In another aspect, an electronic device is provided to include a semiconductor memory that includes: a variable resistance element including a stack of a first magnetic layer, a tunnel barrier layer and a second barrier layer; a contact plug coupling the top of the variable resistance element and including a pillar-type magnetism correcting layer; and a conductive layer coupled to the variable resistance element through the contact plug.

In some implementations, the contact plug may include a cylinder-type metal layer, the magnetic correcting layer may be formed in the cylinder-type metal layer, or the contact plug may include a cylinder-type metal layer, and the magnetism correcting layer may be formed in the cylinder-type metal layer.

In another aspect, an electronic device is provided to include a semiconductor memory that includes: a variable resistance element including a stack of a first magnetic layer, a tunnel barrier layer and a second barrier layer; a contact plug coupling the top of the variable resistance element and including first and second magnetism correcting layers; and a conductive layer coupled to the variable resistance element through the contact plug.

In some implementations, the contact plug may comprise a cylinder-type metal layer, the first magnetism correcting layer may be of a cylinder type and may include the cylinder-type metal layer therein, and the second magnetism correcting layer may be of a pillar type and disposed inside the cylinder-type metal layer.

In another aspect, a method is provided for fabricating an electronic device having a semiconductor memory unit. This method includes: forming on a substrate a variable resistance element including a stack of a first magnetic layer, a tunnel barrier layer and a second magnetic layer; forming a contact plug connecting the variable resistance element and including a magnetism correcting layer; and forming a conductive line that is coupled to the variable resistance element through the contact plug. In another aspect, a method for fabricating an electronic device having a semiconductor memory unit is provided to include forming a variable resistance element over a substrate, wherein the variable resistance element includes a stack of a first magnetic layer having a variable magnetization, a tunnel barrier layer, and a second magnetic layer having a pinned magnetization; forming a contact plug connecting to the variable resistance element and including a magnetism correcting layer that produces a magnetic field at the variable resistance element to reduce an influence of a magnetic field of the second magnetic layer on the first magnetic layer; and forming a conductive line that is coupled to the variable resistance element through the contact plug.

Implementations of the above aspects may include one or more of the following.

In some implementations, the forming of the variable resistance element may include: forming the first magnetic layer on the substrate; forming the tunnel barrier layer on the first magnetic layer; forming the second magnetic layer on the tunnel barrier layer; and patterning the second magnetic layer, the tunnel barrier layer and the first magnetic layer to form the variable resistance element.

In some implementations, the forming of the contact plug may include: forming an interlayer insulating layer over the substrate and the variable resistance element on the substrate; forming a contact hole that passes through the interlayer insulating layer to expose the top of the variable resistance element; and forming a conductive material having a magnetization to fill the contact hole.

In some implementations, the forming of the contact plug may include: forming an interlayer insulating layer over the substrate and the variable resistance element on the substrate; forming a contact hole that passes through the interlayer insulating layer to expose the top of the variable resistance element; forming a first conductive material on a sidewall of the contact hole; and forming a second conductive material to fill the contact hole coated with the first conductive material.

In some implementations, the first conductive material may include a conductive material having a magnetization, and the second conductive material may include a conductive material having no magnetization. In some implementations, the first conductive material may include a conductive material having no magnetization, and the second conductive material may include a conductive material having magnetization.

In some implementations, the forming of the contact plug may include: forming an interlayer insulating layer over the substrate and the variable resistance element on the substrate; forming a contact hole that passes through the interlayer insulating layer to expose the top of the variable resistance element; depositing a first conductive material on a sidewall of the contact hole; and forming a second conductive material over a sidewall of the first conductive material and a bottom of the contact hole; and forming a third conductive material over the second conductive material to fill the contact hole.

In some implementations, the magnetic properties of the first conductive material and the third conductive material may differ from those of the second conductive material. In some implementations, the first conductive material and the third conductive material may include a respective conductive material having a magnetization, and wherein the second conductive material may include a conductive material having no magnetization. In some implementations, each of the first conductive material and the third conductive material may include a conductive material having no magnetization, and the second conductive material may include a conductive material having a magnetization.

In another aspect, an electronic device is provided to include a semiconductor memory that includes: variable resistance elements as storage elements, each variable resistance element including a stack of layers that include a free magnetic layer exhibiting a variable magnetization, a tunnel barrier layer, and a pinned magnetic layer exhibiting a fixed magnetization; a first set of contact plugs disposed on and electrically coupled to first terminals of the variable resistance elements each having a first terminal and a second terminal, respectively, each contact plug including a magnetism correcting layer that produces a magnetic field at the respective variable resistance element to reduce an influence of a magnetic field of the respective pinned magnetic layer on the respective free magnetic layer; and a first set of conductive lines coupled to the first set of contact plugs, respectively, to be electrically coupled to the first terminals of the variable resistance elements, respectively.

Implementations of the above aspects may include one or more of the following.

In some implementations, the electronic device further includes: switching elements coupled and operable to turn on or off electrical paths to the second terminals of the variable resistant elements, respectively; a second set of contact plugs, wherein each of the second set of contact plugs is arranged between adjacent variable resistance elements to be apart from each of the adjacent variable resistance elements; and a second set of conductive lines electrically coupled to, respectively, the switching elements, the second set of contact plugs, and the variable resistance elements.

In some implementations, the first set of conductive lines are bit lines and the second set of conductive lines are source lines.

These and other aspects, implementations and associated advantages are described in greater detail in the drawings, the description and the claims.

DETAILED DESCRIPTION

Figure 1:
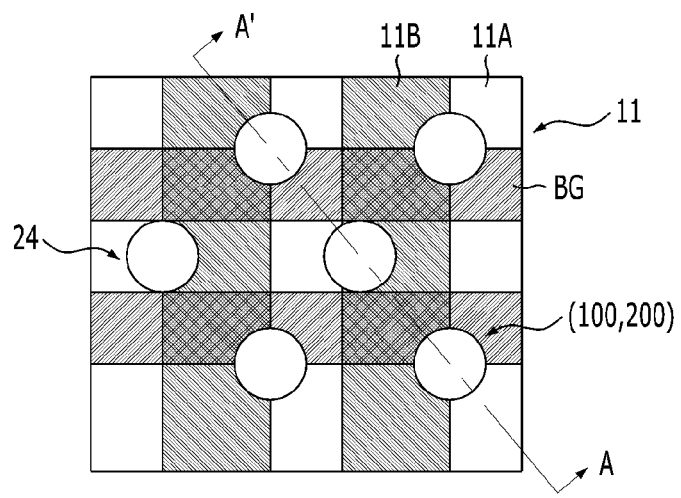
FIG. 1 shows a top view of an electronic device comprising variable resistance elements according to an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Implementations of the disclosed technology provide electronic devices including variable resistance elements and fabrication methods thereof, in which the total thickness of a variable resistance stack within a variable resistance element can be reduced so that an etching margin during a patterning process can be increased. Generally, in some vertical variable resistance elements designs, a magnetism correcting layer is provided on or over a pinned layer in order to prevent the field of a second magnetic layer (i.e., the free layer) from being shifted due to the stray field of the pinned layer. In these designs, however, due to the thickness of the magnetism correcting layer, the magnetic properties of the sidewall of the variable resistance element are degraded due to etching damage, and the problem of circuit shorting between the elements arises due to re-deposition of etching byproducts. In addition, the etching time increases, and this increase makes it difficult to achieve a sufficiently large process margin. The disclosed technology provides designs and fabrication techniques of electronic devices including variable resistance elements comprising a magnetism correcting layer can be effectively formed to mitigate the effect of the stray magnetic field while reducing the total thickness of the variable resistance element.

FIG. 1 shows an example of a top view of an electronic device comprising variable resistance elements according to an implementation of the disclosed technology. As shown in FIG. 1, in a semiconductor 11 in form of a substrate an element isolation layer 11A and a line-type active region 11B are formed. In addition, switching elements represented by buried gates (BG) are formed in a direction intersecting the active regions 11B. Various other implementations of the line-type active regions and the switching elements BG are possible. The active regions 11B may include island-type active regions and so on, and the switching elements may include, in addition to the buried type gates, various other applicable gate types, including a recess type, a flat plate type or a vertical type gates.

In the active regions 11B, variable resistance elements 100 and source line contacts (SLC) 24 may be formed. Herein, the variable resistance elements 100 may be arranged in a matrix configuration and contact plugs 200 are respectively formed over the variable resistance elements 100 to provide electrical contacts. The variable resistance elements 100 and the source line contacts 24 may be alternately arranged, and the source line contacts 24 may be arranged between a pair of the switching elements BG. In addition, the source line contacts 24 may be arranged such that they have a constant spacing with respect to the variable resistance elements 100.

Figure 2:
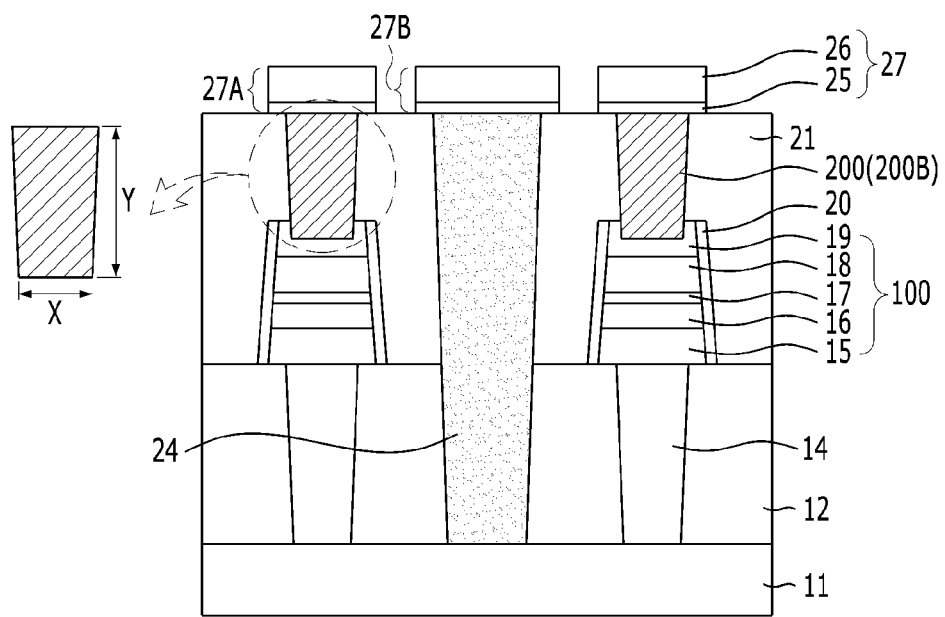
FIG. 2 provides a cross-sectional view taken along line A-A' of the electronic device illustrated in FIG. 1 according to an implementation of the disclosed technology.

FIG. 2 provides a cross-sectional view taken along line A-A' of the electronic device illustrated in FIG. 1 according to an implementation of the disclosed technology.

As shown in FIG. 2, the electronic device according to this implementation may include additional structures on the substrate 11 including, for example, switching elements, a first interlayer insulating layer 12, and a first set of contact plugs 14 that pass through the first interlayer insulating layer 12 to electrically couple one end of the switching elements to the variable resistance elements 100.

The variable resistance elements 100 may be formed on the first interlayer insulating layer 12. Further, the electronic device may include a second interlayer insulating layer 21 occupying the spaces between the variable resistance elements 100, and first and second conductive lines 27A and 27B formed on the second interlayer insulating layer 21.

In addition, the electronic device may further include second contact plugs 200 that pass through the second interlayer insulating layer 21 to electrically couple the variable resistance elements 100 with the first conductive line 27A. Each second contact plug 200 may include a magnetism correcting layer configured to prevent the magnetic field shifting of a corresponding underlying variable resistance element 100.

Further referred to FIG. 2, the electronic device may include, between the variable resistance elements 100, third contact plugs 24 that pass through both the first and second interlayer insulating layers 12 and 21 to electrically couple the second conductive line 27B to the substrate 11.

Each variable resistance element 100 may include a stack of a first electrode 15, a first magnetic layer 16, a tunnel barrier layer 17, a second magnetic layer 18 and a second electrode 19. In addition, a spacer 20 may be formed on the sidewall of the variable resistance element 100. Particularly, the variable resistance element 100 of this implementation includes no magnetism correcting layer in the stack and a magnetism correcting layer for the variable resistance element 100 is formed outside the variable resistance element 100.

Each variable resistance element 100 can switch between different resistance states depending on the magnetization directions of the two magnetic layers 16 and 18. For example, when the magnetization directions of the two magnetic layers 16 and 18 are substantially the same (or substantially parallel to each other), the variable resistance element 100 can have a low resistance state, and when the magnetization directions of the two magnetic layers 16 and 18 are different (e.g., semi-parallel to each other in substantially opposite directions), the variable resistance element 100 can have a high resistance state.

In some embodiments, one of the first magnetic layer 16 and the second magnetic layer 18 may be a pinned ferromagnetic layer of which the magnetization direction is pinned at a fixed direction, and the other magnetic layer may be a free ferromagnetic layer of which the magnetization direction can be varied depending on the direction of a current that is applied to the variable resistance element 100. Each of the first and second magnetic layers 16 and 18 may be a single layer or multiple layers including a ferromagnetic material, for example, a Fe—Pt alloy, a Fe—Pd alloy, a Co—Pd alloy, a Co—Pt alloy, a Co—Fe alloy, a Fe—Ni—Pt alloy, a Co—Fe—Pt alloy, a Co—Ni—Pt alloy and so on, and may further include impurities such as boron (B). Other implementations in addition to the particular ferromagnetic materials described above are also possible.

The tunnel barrier layer 17 allows the tunneling of electrons between the first and second magnetic layers 16 and 18, making it possible to change the magnetization direction of the free ferromagnetic layer. The tunnel barrier layer 17 may be a single layer or multiple layers including a dielectric material, for example, an oxide such as $Al_2O_3$, MgO, CaO, SrO, TiO, VO, NbO or others, but other implementations are also possible.

Each of the first electrode 15, the second electrode 19 and the conductive lines 27A and 27B may include a metallic layer. The metallic layer is an electrically conductive layer that may include a metal layer, a metal oxide layer, a metal nitride layer, a metal oxy-nitride layer, a metal silicide layer or others. Moreover, the first and second conductive lines 27A and 27B can be formed simultaneously using the same mask. Depending on portions of the device structures they are coupled to, the first conductive lines 27A can become bit lines, and the second conductive line 27B can become source lines, or vice versa. For example, in the embodiment of FIG. 2, the first conductive lines 27A are bit lines, and the second conductive line 27B are source lines.

The first electrode 15 can function as a bottom electrode for the variable resistance element 100. The second electrode 19 can serve as a top electrode for the variable resistance element 100. The second electrode 19 can also function to protect the underlying layers of the variable resistance element 100 during fabrication processes, and may function as an etch barrier for patterning of these layers.

The switching element functions to select a specific unit cell in the electronic device that comprises a plurality of unit cells. A switching element may be arranged for each unit cell and the switching element may include a transistor, a diode and so on. One end of the switching element may be electrically coupled to the first contact plug 14, and the other end may be electrically coupled to a source line through the third contact plug 24.

The first and third contact plugs 14 and 24 may include a semiconductor or metallic layer, and the linewidth of the variable resistance element 100 may be greater than the linewidth (or area) of the first and third contact plugs 14 and 24. The first contact plug 14 that contacts the bottom electrode of the variable resistance element 100 can function as a bottom electrode contact (BEC), and the third contact plug 24 can function as a source line contact (SLC) for coupling the substrate 11 to the second conductive line 27B, that is, a source line. The third contact plugs 24 and the variable resistance elements 100 may be alternately arranged as shown in the top view of the arrangement in FIG. 1

In some implementations, each second contact plug 200 may further include a magnetism correcting layer configured to prevent the magnetic field shifting of a corresponding underlying variable resistance element 100. A second contact plug 200 that contacts the top electrode of the variable resistance element 100 can function as a top electrode contact (TEC).

Particularly, FIG. 2 shows a the entire second contact plug 200 is constructed as the magnetism correcting layer. However, various other implementations of the magnetism correcting layer are possible. For example, the magnetism correcting layer may be formed as a part of the second contact plug 200. Moreover, the magnetism correcting layer may have a pillar shape, a ring shape, a cylinder shape, an inner pillar shape, or mixed shape of the above, among other shapes. In some embodiments, the magnetism correcting layer may be formed inside the second contact plug 200. These different configurations of the magnetism correcting layer are described in more detail below.

The second contact plug 200 including the magnetism correcting layer can be configured to offset the influence of the magnetic field of the pinned ferromagnetic layer on the free ferromagnetic layer, thereby preventing the magnetic field shifting of the free ferromagnetic layer. The second contact plug 200 including the magnetism correcting layer can be constructed to have a magnetization direction opposite to that of the pinned ferromagnetic layer and may include a ferromagnetic or antiferromagnetic material. For example, the second contact plug 200 including the magnetism correcting layer may include a material having a horizontal or in-plane magnetization that is parallel to the layer and may include a ferromagnetic material, such as Co, Fe, Ni, Nb, or a mixture of the above. The second contact plug 200 may include a magnetic material that has a horizontal or in-plane magnetization that is parallel to the layer and is electrically conductive so it can be used as a part of an electrical interconnection based on its electrical conductivity.

The second contact plug 200 including the magnetism correcting layer may be formed such that the thickness Y is greater than the linewidth X (Y>X, as shown in FIG. 2), so that a spin arrangement can be induced vertically.

In the above described implementations, the magnetism correcting layer is not formed in the variable resistance element 100, but is formed as part of the second contact plug 200 at the top of and outside of the variable resistance element 100. As a result, the total thickness of the variable resistance element 100 can be reduced. Because the magnetism correcting layer is formed separately from the variable resistance element 100, the total thickness of the variable resistance element 100 can be reduced by the thickness of the magnetism correcting layer comparing to a design wherein the magnetism correcting layer is part of the variable resistance element. Under the current design, the etching burden during a patterning process for the formation of the element can be reduced due to the reduced thickness of the variable resistance element 100. For this reason, damage to the sidewall and re-deposition of etch byproducts during the patterning process can also be reduced, and thus the magnetic properties of the variable resistance element can be improved. In addition, because the magnetism correcting layer is not made of a material having a vertical magnetization that is perpendicular to the layer but one with horizontal or in-plane magnetization, processing difficulty level can be reduced. Further, the shape and volume of the magnetism correcting layer can be controlled with higher flexibility based on the design requirements using a material having proper magnetic properties.

FIGS. 3A to 3I illustrate a process for fabricating the electronic device illustrated in FIG. 2 according to a first implementation of the disclosed technology. More specifically, FIGS. 3A to 3I provide cross-sectional views taken along line A-A' of FIG. 1. In FIGS. 1 to 3, like reference numerals are used for like parts in order to help understanding.

Figure 3A:
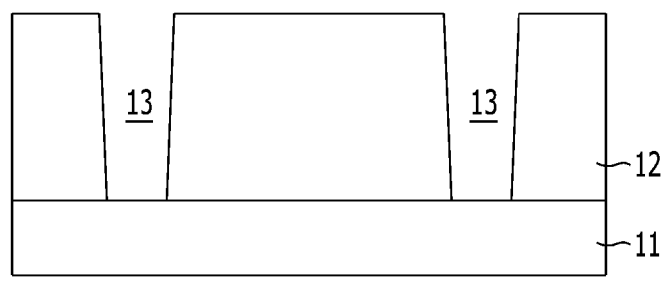
FIGS. 3A to 3I illustrate a process for fabricating the electronic device illustrated in FIG. 2 according to a first implementation of the disclosed technology.

As shown in FIG. 3A, a substrate 11 is provided on which the rest of the structures are to be formed including, for example, switching elements (not shown). In some implementations, the switching element is operable to select a specific unit cell in the electronic device that includes a plurality of unit cells, and the switching element may include a transistor, a diode or the like. One end of the switching element may be electrically coupled to a first contact plug to be described later, and the other end may be electrically coupled to a source line through a third contact plug to be described below.

Next, a first interlayer insulating layer 12 is formed on the substrate 11. The first interlayer insulating layer 12 may be formed as a single layer selected from the group including an oxide layer, a nitride layer and an oxy-nitride layer, or the first interlayer insulating layer 12 may have a multilayer structure comprising layers of the above listed layers.

Next, first contact holes 13 are formed which pass through the first interlayer insulating layer 12 to expose the substrate 11.

Figure 3B:
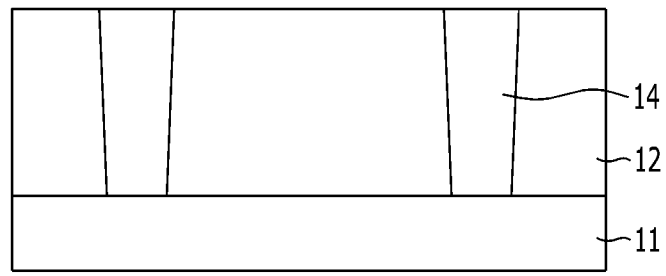

Referring to FIG. 3B, the process next deposits a conductive material to fill in the first contact holes 13 to form a set first set of contact plugs 14. The first contact plugs 14 can be formed through a series of steps, including forming a conductive material on the entire surfaced so as to performing a gap-fill step to fill up the first contact holes 13, and electrically isolating between adjacent first contact plugs 14. The isolation process can be performed by etching (or polishing) the conductive material, formed on the entire surface, using a blanket etching process (e.g., etch-back process) or using a chemical mechanical polishing until the first interlayer insulating layer 12 is exposed.

Figure 3C:
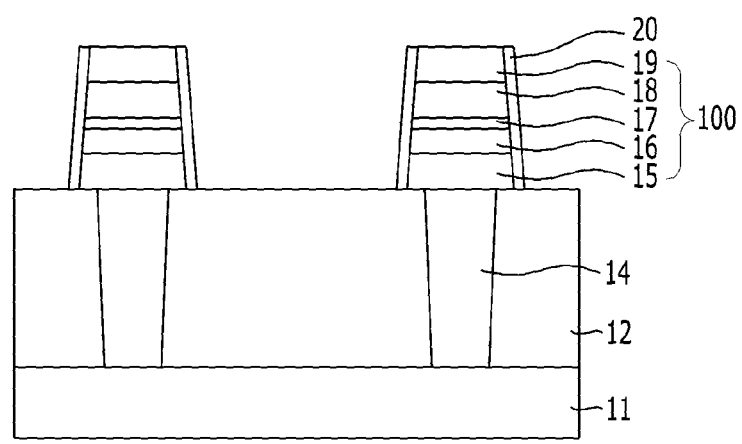

Referring to FIG. 3C, the process then forms variable resistance elements 100 on the first interlayer insulating layer 12 that includes the first contact plugs 14. Each variable resistance element 100 includes a stack of a first electrode 15, a first magnetic layer 16, a tunnel barrier layer 17, a second magnetic layer 18 and a second electrode 19 and may include a spacer 20 formed on the sidewall of the stack. Although not shown in FIG. 3D, some implementations of the variable resistance element 100 may further include a template layer, a binder layer and an interface layer in order to improve the properties of the magnetic layers 16 and 18.

Notably, in this implementation, the variable resistance element 100 includes no magnetism correcting layer in the stack. Consequently, because the total thickness of the stack can be reduced by the thickness of the magnetism correcting layer, the etching burden during the patterning process for the formation of the element can be reduced. For this reason, damage to the sidewall and re-deposition of etching byproduct during the patterning process can be reduced, and thus the magnetic properties of the variable resistance element can be improved.

The variable resistance element 100 can switch between different resistance states depending on the magnetization directions of the two magnetic layers 16 and 18. For example, when the magnetization directions of the two magnetic layers 16 and 18 are substantially the same (or substantially parallel to each other), the variable resistance element 100 can have a low resistance state, and when the magnetization directions of the two magnetic layers 16 and 18 are different (e.g., or semi-parallel to each other in substantially opposite directions), the variable resistance element 100 can have a high resistance state.

In some embodiments, any one of the first magnetic layer 16 and the second magnetic layer 18 may be a pinned ferromagnetic layer of which the magnetization direction is pinned in a fixed direction, and the other magnetic layer may be a free ferromagnetic layer of which the magnetization direction can be varied depending on the direction of a current that is applied to the variable resistance element 100. Each of the first and second magnetic layers 16 and 18 may be a single layer or multiple layers including a ferromagnetic material, for example, a Fe—Pt alloy, a Fe—Pd alloy, a Co—Pd alloy, a Co—Pt alloy, a Co—Fe alloy, a Fe—Ni—Pt alloy, a Co—Fe—Pt alloy, a Co—Ni—Pt alloy and so on, and may further include impurities such as boron (B). Other implementations beyond the particular ferromagnetic materials described above are possible.

The tunnel barrier layer 17 allows the tunneling of electrons between the first and second magnetic layers 16 and 18, making it possible to change the magnetization direction of the free ferromagnetic layer. The tunnel barrier layer 17 may be a single layer or multiple layers including a dielectric material, for example, an oxide, such as $Al_2O_3$, MgO, CaO, SrO, TiO, VO, NbO or others. Other implementations are possible.

Each of the first electrode 15 and the second electrode 19 may include a metallic layer. The metallic layer is an electrically conductive layer that may include a metal layer, a metal oxide layer, a metal nitride layer, a metal oxy-nitride layer, a metal silicide layer and so on.

The first electrode 15 can function as a bottom electrode for the variable resistance element 100. The second electrode 19 can serve as a top electrode for the variable resistance element 100. The second electrode 19 can also function to protect the underlying layers of the variable resistance element 100 during fabrication processes, and may function as an etch barrier for patterning of these layers. In addition, the first contact plug 14 coupled to the first electrode 15 can function as a bottom electrode contact (BEC).

Figure 3D:
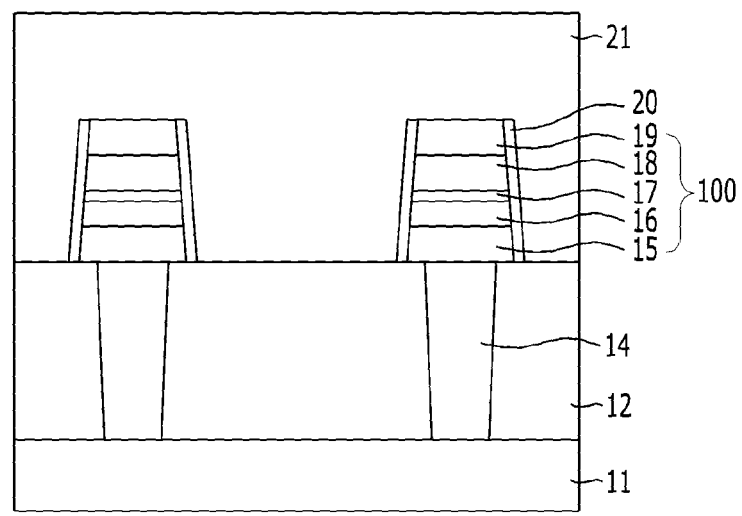

Referring now to FIG. 3D, the process next forms a second interlayer insulating layer 21 on the first interlayer insulating layer 12 and the variable resistance element 100. The second interlayer insulating layer 21 may be formed to have a thickness sufficient to fill gaps between the variable resistance elements 100. For example, the second interlayer insulating layer 21 may be formed to have a surface level higher than the upper surface of the variable resistance elements 100. The second interlayer insulating layer 21 may be formed of the same material as that of the first interlayer insulating layer 12. For example, the second interlayer insulating layer 21 may be formed of any single layer selected from the group comprising an oxide layer, a nitride layer and an oxy-nitride layer, or layer 21 may be formed of a stack of these layers.

Figure 3E:
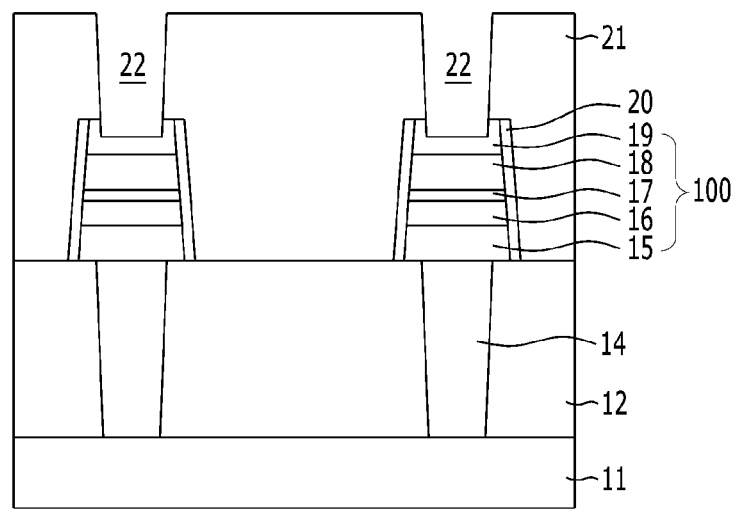

Referring to FIG. 3E, the second interlayer insulating layer 21 is then selectively etched to form second contact holes 22 that expose the top surface of the variable resistance elements 100. The second contact holes 22 may include a portion of the thickness of the second electrode 19. In other words, in the etching process for forming the second contact holes 22, a portion of the thickness of the second electrode 19 may be removed by over-etching.

Figure 3F:
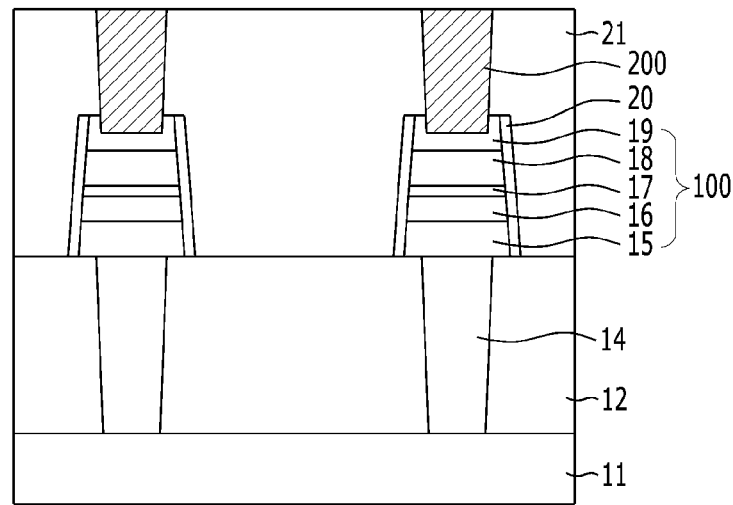

Referring to FIG. 3F, the process then deposits a conductive material to fill in the second contact holes 22 to form a second set of contact plugs 200. The second set of contact plugs can function to electrically couple the variable resistance element 100 to a conductive line to be formed in a subsequent process, and it can function as an electrode (e.g., top electrode contact (TEC)) for the variable resistance element 100.

The second contact plugs 200 can be formed through a series of steps, including forming the conductive material on the entire surface so as to gap-fill the second contact holes 22, and electrically insulating spaces between adjacent contact plugs 200. The insulation process can be performed by etching (or polishing) the conductive material, which was formed on the entire surface, using a blanket etching process (e.g., etch-back process) or using a chemical mechanical polishing process until the second interlayer insulating layer 21 is exposed.

Notably, in this implementation, the second set of contact plugs 200 may be formed of a conductive material having magnetic properties, that is, a ferromagnetic or antiferromagnetic material, and thus it can function as a magnetism correcting layer that prevents the magnetic field shifting of the variable resistance element 100.

Each second contact plug 200 functions to offset the influence of the magnetic field of the pinned ferromagnetic layer on the free ferromagnetic layer, thereby preventing the magnetic field shifting of the free ferromagnetic layer. In particular implementations, the second contact plug 200 is or includes a magnetism correcting layer having a magnetization direction opposite to that of the pinned ferromagnetic layer and may include, in some implementations, a ferromagnetic or antiferromagnetic material. For example, the second contact plug 200 may include a material having a horizontal magnetization and may include a ferromagnetic material, such as Co, Fe, Ni, Nb, or a mixture of the above. Generally, the second contact plug 200 may include any magnetic material that has a horizontal magnetization and can be used as a part of an interconnect based on its conductivity.

The second contact plugs 200 can be formed by sputtering, PECVD (i.e., plasma enhanced chemical vapor deposition), LPCVD (i.e., low pressure chemical vapor deposition), atomic layer deposition (i.e., ALD) and so on.

Each second contact plug 200 may be formed such that the thickness Y of the plug is greater than the linewidth X (Y>X, as shown in FIG. 2), so that a spin arrangement can be induced vertically.

In the implementation of FIG. 3F, the second contact plug 200 is formed as the magnetism correcting layer. However, in other implementations, the magnetism correcting layer may constitutes only a portion of the second contact plug 200 or may be formed inside the second contact plug 200. Specifically, the magnetism correcting layer may have a pillar-type or cylinder-type structure.

As described above, in some disclosed implementations, the magnetism correcting layer is not made of a vertical magnetic material having a vertical magnetization, but one with horizontal magnetization. As a result, processing difficulty can be reduced. Furthermore, the shape and volume of the magnetism correcting layer can be controlled with higher flexibility based on the design requirements using a material having proper magnetic properties.

In addition, a portion of the thickness of the second electrode 19 is removed during the formation of the second contact hole 22 (see FIG. 3E) to increase the contact area between the variable resistance element 100 and the second contact plug 200, thereby reducing the interfacial resistance between the two. Moreover, by etching into the second electrode 19, a reduction in the effectiveness of preventing magnetic field shifting due to an increase in the spacing between the variable resistance element 100 and the magnetization compensation layer can be minimized.

Figure 3G:
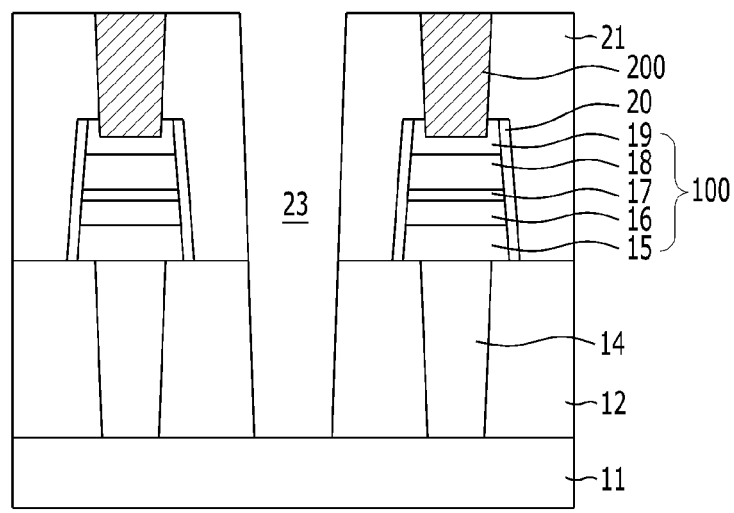

Referring to FIG. 3G, the process next selectively etches the first and second interlayer insulating layers 12 and 21 between the variable resistance elements 100 to form third contact holes 23 that expose the substrate 11.

The third contact holes 23 and the variable resistance elements 100 may be alternately arranged as shown in the arrangement view of FIG. 1. In addition, patterning can be performed such that third contact plugs to be formed in a subsequent process are arranged at a constant distance from a plurality of the variable resistance elements 100 as shown in the arrangement view of FIG. 1.

Figure 3H:
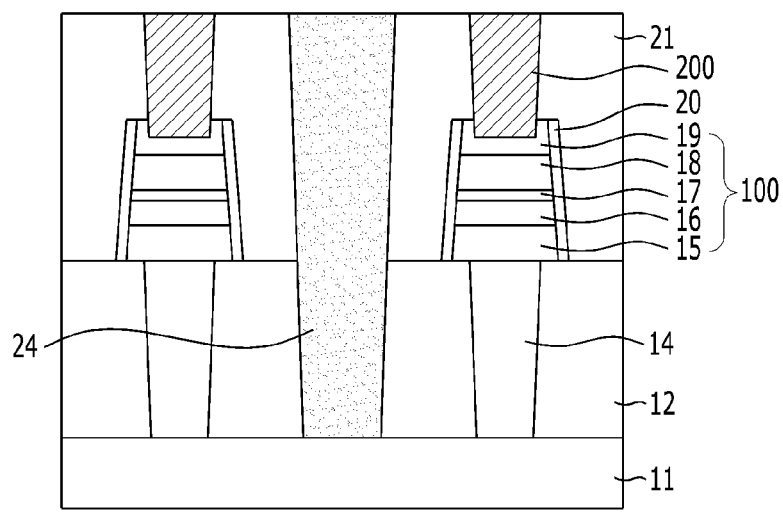
Figure 3I:
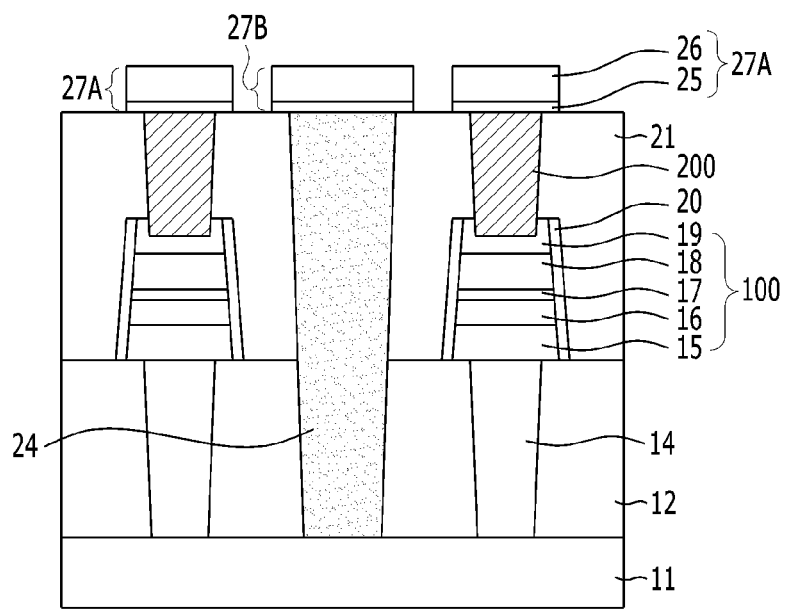

Referring to FIG. 3H, the process then deposits a conductive material to fill in the third contact holes 23 (see FIG. 3G) to form third contact plugs 24. The third set of contact plug 24 may be a contact plug that electrically couples the substrate 11 to a conductive line (i.e., a source line) to be formed in a subsequent process, and this contact plug may also be referred to as a "source line contact" (SLC).

Referring to FIG. 31, first and second conductive lines 27A and 27B are subsequently formed on the second interlayer insulating layer 21 including the second contact plug 200 and the third contact plug 24.

Each of the first and second conductive lines 27A and 27B may include a stack of a barrier layer 25 and a metallic layer 26. The metallic layer is conductive layer including a metal element and may include a metal layer, a metal oxide layer, a metal nitride layer, a metal oxy-nitride layer, a metal silicide layer and so on. In addition, the first and second conductive lines 27A and 27B can be formed simultaneously using the same mask. Depending on portions of device structures to which they are coupled to, the first conductive lines 27A can become bit lines, and the second conductive line 27B can become source lines or vice versa. For example, in the embodiment of FIG. 31, the first conductive lines 27A are bit lines, and the second conductive line 27B are source lines.

Figure 4:
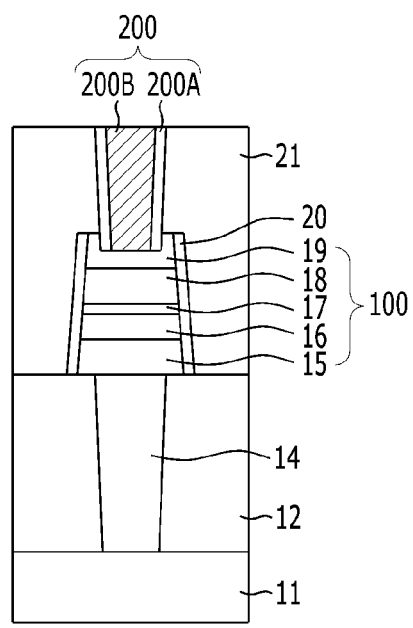
FIG. 4 provides a cross-sectional view showing an exemplary structure of a top electrode contact including a magnetization compensation layer according to a implementation of the disclosed technology.

FIG. 4 provides a cross-sectional view showing an example of a structure of a top electrode contact including a magnetism correcting layer according to a implementation of the disclosed technology. The top electrode contact plug shown in FIG. 4 corresponds to the second contact plug 200 shown in FIG. 2 and is designated with the same reference numeral to help understanding.

As shown in FIG. 4, the electronic device according to this implementation may include a substrate 11 which includes a switching element, a first interlayer insulating layer 12 formed on the substrate 11, and a first contact plug 14 that passes through the first interlayer insulating layer 12 to electrically couple one end of the switching element to a variable resistance element 100.

The variable resistance element 100 may be formed on the first interlayer insulating layer 12. The variable resistance element 100 may include a stack of a first electrode 15, a first magnetic layer 16, a tunnel barrier layer 17, a second magnetic layer 18 and a second electrode 19. In addition, a spacer 20 may be formed on the sidewall of the variable resistance element 100. Notably, the variable resistance element 100 of this implementation includes no magnetism correcting layer in the stack.

Additionally, the electronic device may include a second interlayer insulating layer 21 that fills the space between the variable resistance elements 100, and a second contact plug 200 that passes through the second interlayer insulating layer 21 to make contact with the variable resistance element 100. The second contact plug 200 can function as a top electrode contact that couples the variable resistance element 100 to a conductive line to be formed in a subsequent process.

The second contact plug 200 may include a magnetism correcting layer 200B configured to prevent the magnetic field shifting of the variable resistance element 100. Notably, the second contact plug 200 may also include a metal layer 200A which may be formed on the sidewall of the magnetization compensation layer 200B.

FIGS. 5A to 5E provide cross-sectional views showing an exemplary process for fabricating the electronic device shown in FIG. 4. FIGS. 5A to 5E will be explained using the same reference numerals as those shown in FIG. 4 to help understanding.

Figure 5A:
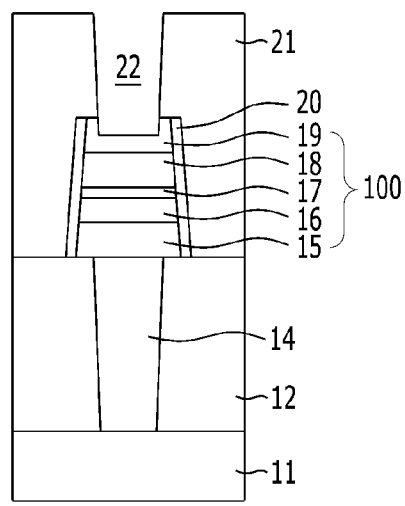
FIGS. 5A to 5E provide cross-sectional views showing an exemplary process for fabricating the electronic device shown in FIG. 4.

As shown in FIG. 5A, a first interlayer insulating layer 12, a first contact plug 14 that passes through the first interlayer insulating layer 12 to contact the substrate 11, and a variable resistance element 100 that is coupled to the substrate 11 through the first contact plug 14, are formed on a substrate 11.

The variable resistance element 100 may include a stack of a first electrode 15, a first magnetic layer 16, a tunnel barrier layer 17, a second magnetic layer 18 and a second electrode 19. In addition, the variable resistance element 100 may include a spacer 20 on the sidewall thereof. Notably, the variable resistance element 100 of this implementation includes no magnetism correcting layer in the stack.

Next, a second interlayer insulating layer 21 is formed on the first interlayer insulating layer 12 to have a thickness sufficient to fill the space between the variable resistance elements 100.

Subsequently, the second interlayer insulating layer 21 is selectively etched to form a contact hole 22 that exposes the top of the variable resistance element 100. The contact hole 22 may include a portion of the thickness of the second electrode 19. In order words, in the etching process for forming the second contact hole 22, a portion of the thickness of the second electrode 19 can be removed by overetching.

Figure 5B:
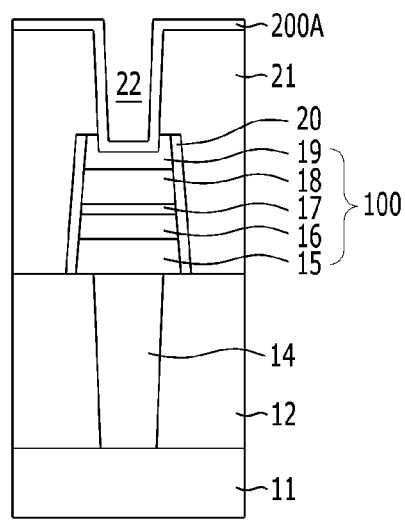

Referring to FIG. 5B, a first conductive layer 200A is deposited over an entire surface of the structure in FIG. 5A including the contact hole 22. The first conductive layer 200A can function as a barrier layer for a magnetism correcting layer to be formed in a subsequent process.

The first conductive layer 200A may be formed of a semiconductor or metallic layer. The semiconductor layer may include a silicon layer. The metallic layer is a layer made of a material including a metal and may include a metal layer, a metal oxide layer, a metal nitride layer, a metal oxy-nitride layer, a metal silicide layer and so on.

Figure 5C:
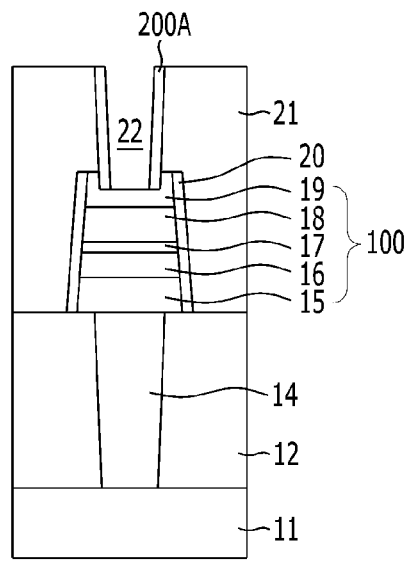

Referring to FIG. 5C, the first conductive layer 200A is subsequently etched away from the top surface and the bottom of the contact hole 22 but remains on the sidewall of the contact hole 22 in the form of a spacer.

Figure 5D:
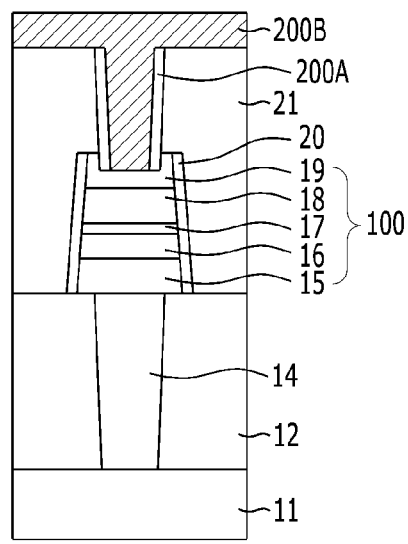

Referring now to FIG. 5D, a conductive layer 200B that fills the contact hole 22 is formed. The conductive layer 200B may include a conductive material having magnetic properties so that the conductive layer 200B can function to offset the influence of the magnetic field of the pinned ferromagnetic layer on the free ferromagnetic layer in the variable resistance element 100, thereby preventing the magnetic field shifting of the free ferromagnetic layer. The conductive layer 200B is a layer having a magnetization direction opposite to that of the pinned ferromagnetic layer and may include a ferromagnetic or anti-ferromagnetic material. For example, the second conductive layer 200B may include a horizontal magnetic material having a horizontal magnetization and may include a ferromagnetic material, such as Co, Fe, Ni, Nb, or a mixture thereof. Generally, the conductive layer 200B may include any magnetic material that has a horizontal magnetization and can be used as part of an interconnect based on its conductivity.

Figure 5E:
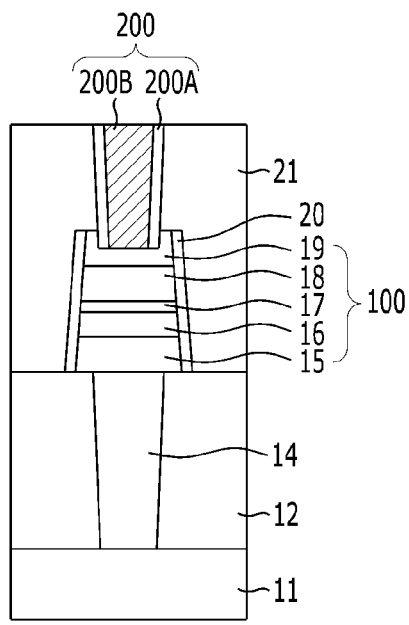

Referring to FIG. 5E, the conductive layer 200B is then etched to electrically isolate conductive layers 200B inside adjacent contact holes 22 and to form a second contact plug 200. The second contact plug 200 may include a pillar-type magnetization compensation layer 200B surrounded by the first conductive layer 200A. The second contact plug 200 can function as a top electrode contact that connects the variable resistance element 100 to a top conductive line.

Figure 6:
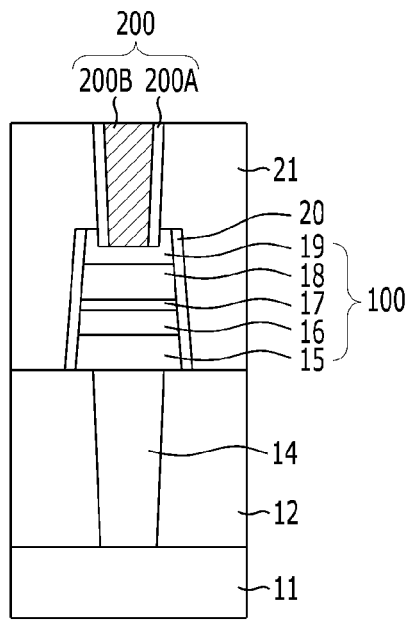
FIG. 6 provides cross-sectional views showing an exemplary structure of a top electrode contact including a magnetization compensation layer of an inner pillar type according to some implementations of the disclosed technology.
Figure 7:
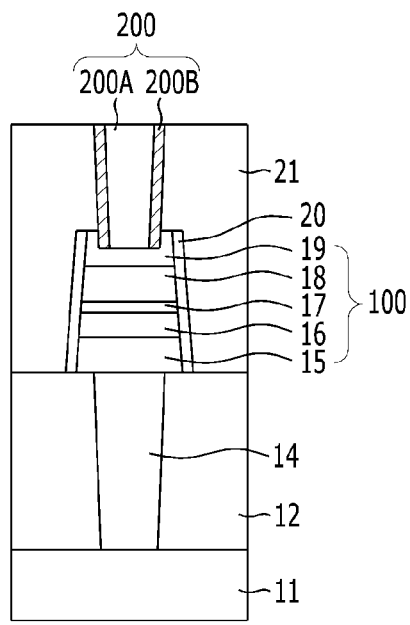
FIG. 7 provides cross-sectional views showing an exemplary structure of a top electrode contact including a magnetization compensation layer of a ring type according to some implementations of the disclosed technology.
Figure 8:
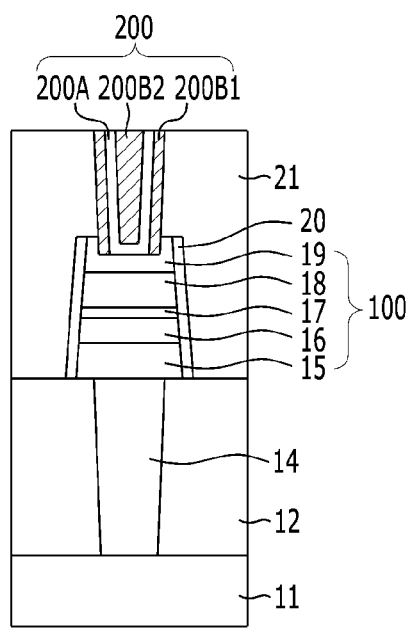
FIG. 8 provides cross-sectional views showing an exemplary structure of a top electrode contact including a plurality of magnetization compensation layers according to some implementations of the disclosed technology

FIGS. 6 to 8 provide cross-sectional views showing exemplary structures of top electrode contacts including a magnetization compensation layer according to some implementations of the disclosed technology.

Note that the second contact plugs shown in FIGS. 6 to 8 correspond to the second contact plug 200 shown in FIG. 2 and will be designated by the same reference numeral to help understanding. Specifically, FIG. 6 shows an inner pillar type magnetism correcting layer, FIG. 7 shows a cylinder type magnetism correcting layer, and FIG. 8 shows a mixed-type magnetism correcting layer.

As shown in FIG. 6, the magnetism correcting layer 200B may be formed of an inner pillar type. Specifically, the magnetism correcting layer 200B can be formed such that it is surrounded by a cylinder-type first conductive layer 200A.

As shown in FIG. 7, the magnetism correcting layer 200B may be formed of a ring type. Specifically, the magnetism correcting layer 200B may be formed on the sidewall of the second contact plug 200 so as to surround the second conductive layer 200A.

As shown in FIG. 8, the second contact plug 200 may include a plurality of magnetism correcting layers 200B1 and 200B2 and a metal layer 200A and the second contact plug 200 may have a mixed-type structure including both a cylinder-type magnetism correcting layer 200A, a ring-type metal layer 200B1 and an inner pillar-type magnetism correcting layer 200B2. In addition to the above illustrated implementations, various other types of the second contact plug 200 may be possible.

Magnetic properties of the ring type magnetism correcting layer 200B1 and the inner pillar-type magnetism correcting layer 200B2 shown in FIG. 8 may differ from the cylinder type magnetism correcting layer 200A. The ring type magnetism correcting layer 200B1 and the inner pillar type magnetism correcting layer 200B2 may include a conductive material having magnetic properties, and the cylinder type magnetism correcting layer 200A may include a conductive material having no magnetic property. Alternatively, the ring type magnetism correcting layer 200B1 and the inner pillar type magnetism correcting layer 200B2 may include a conductive material having no magnetic property, and the cylinder type magnetism correcting layer 200A may include a conductive material having magnetic properties. Memory circuits or electronic devices of the above-described implementations can be used in various devices or systems.

Note that in various examples of the electronic devices described above, the top electrode contact, which is electrically coupled to the variable resistance element, also includes the magnetism correcting layer, is applied. As a result, the total thickness of the variable resistance element is reduced and an etching margin during a patterning process for the formation of the variable resistance element is improved.

In addition, the magnetism correcting layer is formed using a material having horizontal magnetization. As a result, the process difficulty level is reduced.

The above and other memory circuits or semiconductor devices based on the disclosed technology can be used in a range of devices or systems. FIGS. 9-13 provide some examples of devices or systems that can implement the memory circuits disclosed herein.

Figure 9:
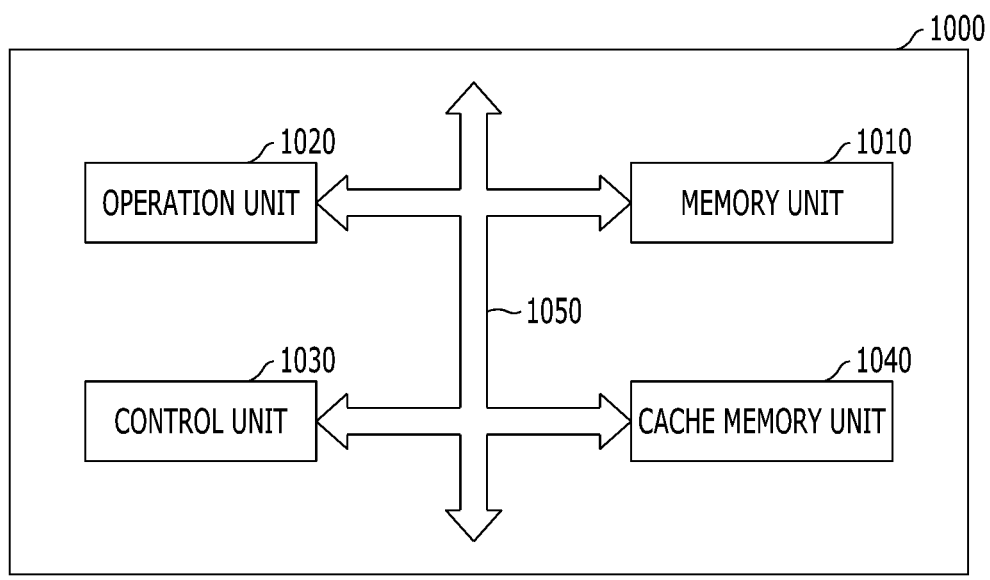
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the memory unit 1010 may become easy and the reliability of the memory unit 1010 may be improved. As a consequence, a fabrication process of the microprocessor 1000 may become easy and the reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
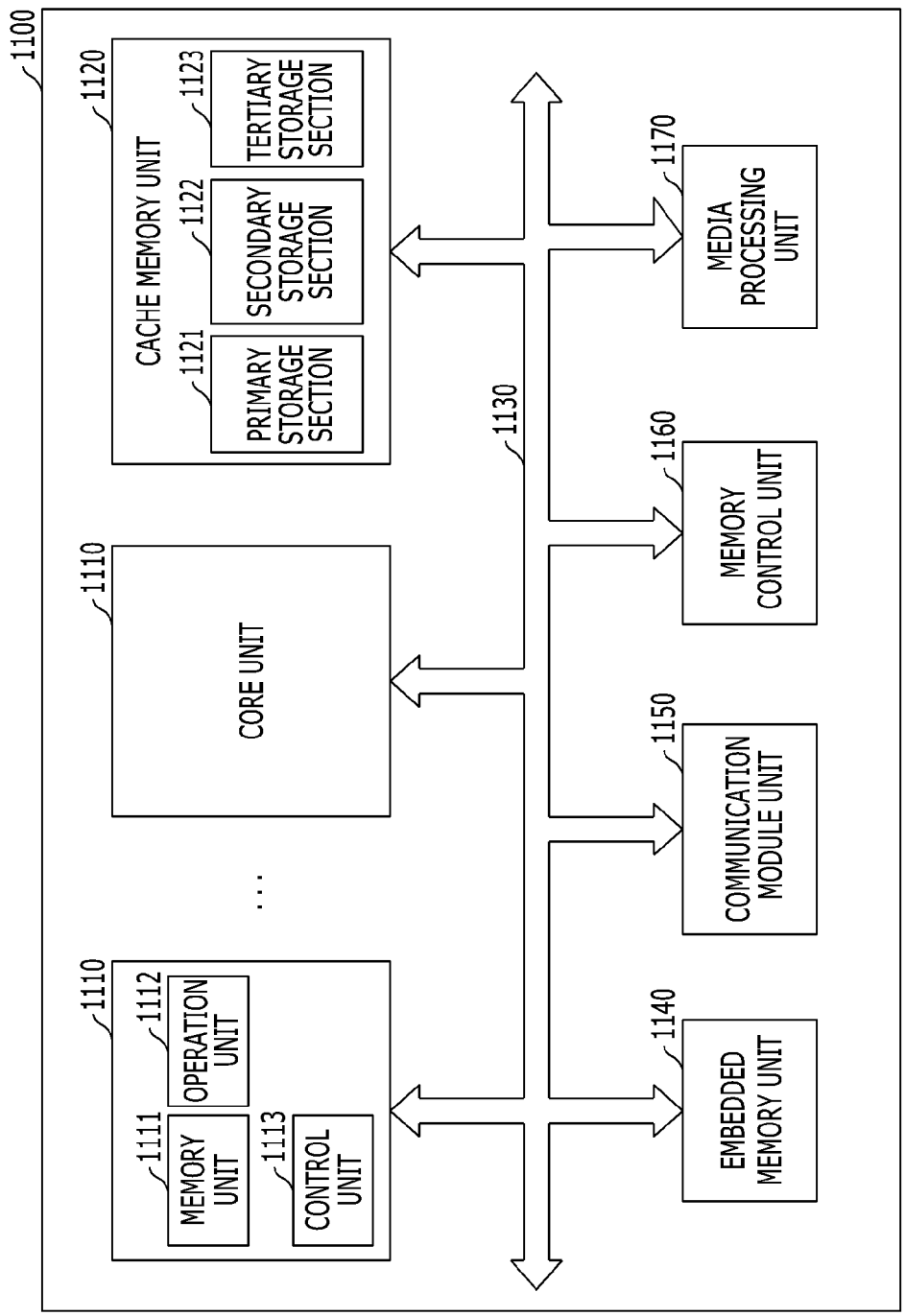
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the cache memory unit 1120 may become easy and the reliability of the cache memory unit 1120 may be improved. As a consequence, a fabrication process of the processor 1100 may become easy and the reliability of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly coupled or be coupled through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being coupled with a wired network, a module capable of being coupled with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
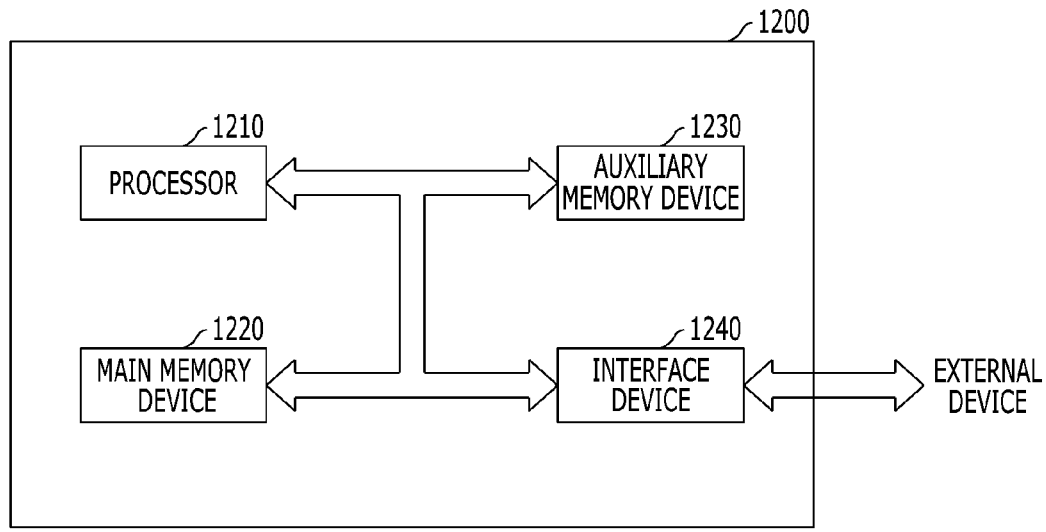
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the main memory device 1220 may become easy and the reliability of the main memory device 1220 may be improved. As a consequence, a fabrication process of the system 1200 may become easy and the reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being coupled with a wired network, a module capable of being coupled with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
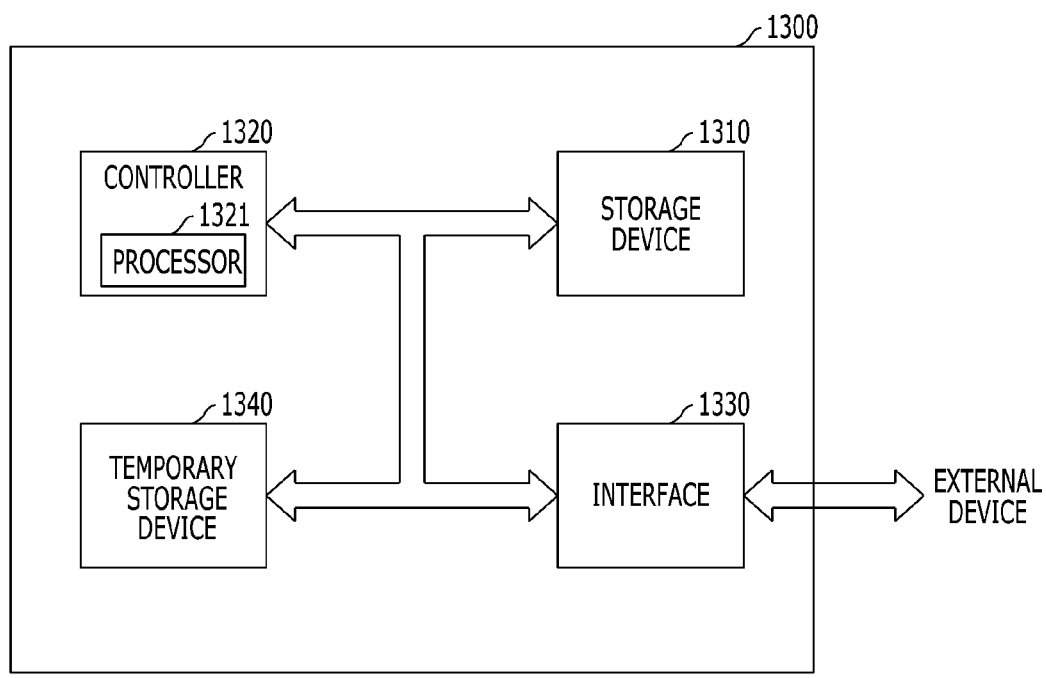
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the storage device 1310 or the temporary storage device 1340 may become easy and the reliability of the storage device 1310 or the temporary storage device 1340 may be improved. As a consequence, a fabrication process of the data storage system 1300 may become easy and the reliability of the data storage system 1300 may be improved.

Figure 13:
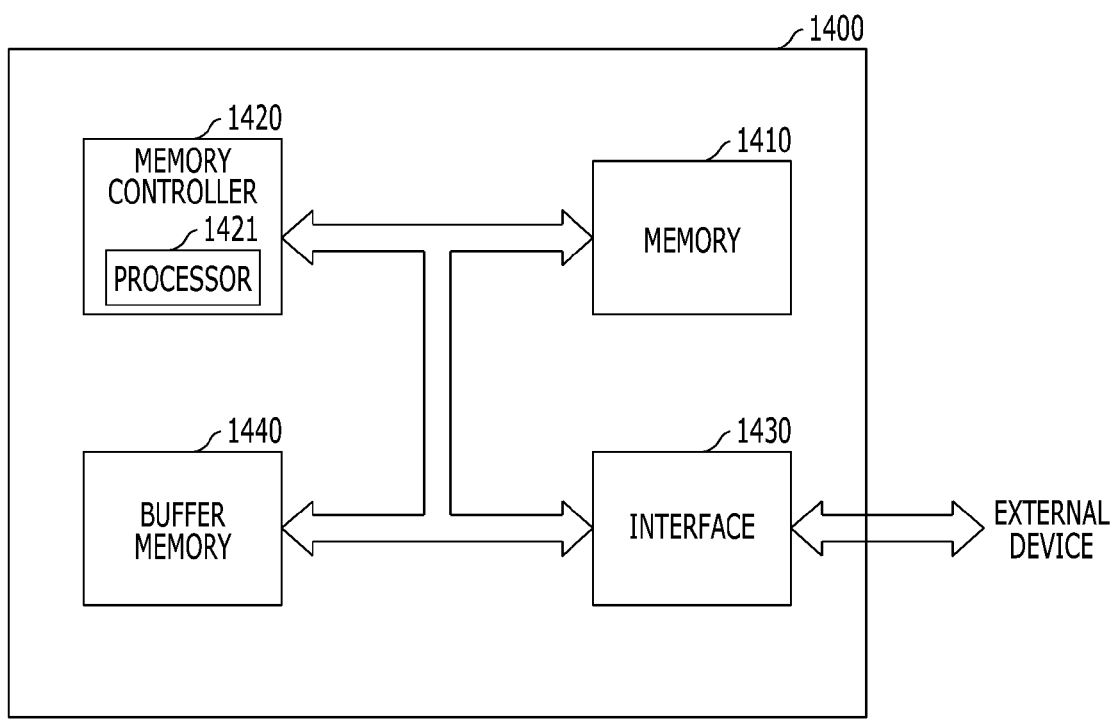
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the memory 1410 may become easy and the reliability of the memory 1410 may be improved. As a consequence, a fabrication process of the memory system 1400 may become easy and the reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element including a stack of a first magnetic layer, a tunnel barrier layer and a second magnetic layer; a contact plug coupling a top of the variable resistance element and including a magnetism correcting layer; and a conductive line coupled to the variable resistance element through the contact plug including the magnetism correcting layer. Through this, a fabrication process of the buffer memory 1440 may become easy and the reliability of the buffer memory 1440 may be improved. As a consequence, a fabrication process of the memory system 1400 may become easy and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   the semiconductor memory comprising:
   a variable resistance element including a stack including a first magnetic layer having a variable magnetization, a tunnel barrier layer, and a second magnetic layer having a pinned magnetization;
   a contact plug coupling a top of the variable resistance element and including a magnetism correcting layer that produces a magnetic field at the variable resistance element to reduce an influence of a magnetic field of the second magnetic layer on the first magnetic layer; and
   a conductive line coupled to the variable resistance element through the contact plug including the magnetism correcting layer.

2. The electronic device of claim 1, wherein a thickness of the magnetism correcting layer is greater than a width of the magnetism correcting layer.

3. The electronic device of claim 1, wherein the magnetism correcting layer includes a conductive material having horizontal magnetic properties wherein a magnetization of the magnetism correcting layer is in a plane of the magnetism correcting layer.

4. The electronic device of claim 1, wherein the magnetism correcting layer includes cobalt (Co), iron (Fe), nickel (Ni), neodymium (Nd), or a mixture of two or more of Co, Fe, Ni and Nd.

5. The electronic device of claim 1, wherein the first magnetic layer and the second magnetic layer are ferromagnetic layers.

6. The electronic device of claim 1, wherein the contact plug further comprises a metal layer.

7. The electronic device of claim 6, wherein the magnetism correcting layer includes a pillar type magnetism correcting layer.

8. The electronic device of claim 7, wherein the metal layer is formed to surround a sidewall of the pillar type magnetism correcting layer.

9. The electronic device of claim 8, wherein the metal layer includes a ring type metal layer.

10. The electronic device of claim 7, wherein the metal layer is formed to surround both a sidewall and a bottom surface of the pillar type magnetism correcting layer.

11. The electronic device of claim 10, wherein the contact plug further comprises
    a ring type magnetism correcting layer formed to surround a sidewall of the metal layer.

12. The electronic device of claim 6, wherein the magnetism correcting layer includes a ring type magnetism correcting layer to surround a sidewall of a pillar type metal layer.

13. The electronic device of claim 1, wherein the magnetism correcting layer comprises:
    a cylinder type metal layer;
    an inner pillar type magnetism correcting layer formed in the cylinder type metal layer; and
    a ring type magnetism correcting layer surrounded a sidewall of the cylinder type metal layer.

14. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the resistance variable element is part of the cache memory unit in the processor.

15. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

16. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory unit that includes the resistance variable element is part of the storage device or the temporary storage device in the data storage system.

17. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory unit that includes the resistance variable element is part of the memory or the buffer memory in the memory system.

18. An electronic device comprising a semiconductor memory unit that includes:
- variable resistance elements as storage elements, each variable resistance element including a stack of layers that include a free magnetic layer exhibiting a variable magnetization, a tunnel barrier layer, and a pinned magnetic layer exhibiting a fixed magnetization;
- a first set of contact plugs disposed on and electrically coupled to first terminals of the variable resistance elements each having a first terminal and a second terminal, respectively, each contact plug including a magnetism correcting layer that produces a magnetic field at the respective variable resistance element to reduce an influence of a magnetic field of the respective pinned magnetic layer on the respective free magnetic layer; and
- a first set of conductive lines coupled to the first set of contact plugs, respectively, to be electrically coupled to the first terminals of the variable resistance elements, respectively.

19. The electronic device of claim 18, further comprising:
- switching elements coupled and operable to turn on or off electrical paths to the second terminals of the variable resistant elements, respectively;
- a second set of contact plugs, wherein each of the second set of contact plugs is arranged between adjacent variable resistance elements to be apart from each of the adjacent variable resistance elements; and
- a second set of conductive lines electrically coupled to, respectively, the switching elements, the second set of contact plugs, and the variable resistance elements.

20. The electronic device of claim 19, wherein the first set of conductive lines are bit lines and the second set of conductive lines are source lines.

* * * * *